US012735363B2

(12) United States Patent
Zhan et al.

(10) Patent No.: US 12,735,363 B2
(45) **Date of Patent: *Sep. 15, 2026**

(54) METHODS OF MAKING NANOPOWDERS, NANOCERAMIC MATERIALS AND NANOCERAMIC COMPONENTS

(71) Applicant: Applied Materials, Inc., Santa Clara, CA (US)

(72) Inventors: Guodong Zhan, Dhahran (SA); Xiaowei Wu, San Jose, CA (US); Xiao Ming He, Fremont, CA (US); Jennifer Y. Sun, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 17 days.

This patent is subject to a terminal disclaimer.

(21) Appl. No.: 18/802,002

(22) Filed: Aug. 13, 2024

(65) Prior Publication Data

US 2024/0400461 A1 Dec. 5, 2024

Related U.S. Application Data

(60) Division of application No. 18/140,372, filed on Apr. 27, 2023, now Pat. No. 12,098,107, which is a (Continued)

(51) Int. Cl.
*C04B 35/628* (2006.01)
*C01F 17/218* (2020.01)
(Continued)

(52) U.S. Cl.
CPC .......... *C04B 35/505* (2013.01); *C01F 17/218* (2020.01); *C01F 17/265* (2020.01); (Continued)

(58) Field of Classification Search
None
See application file for complete search history.

(56) References Cited

U.S. PATENT DOCUMENTS 4,900,492 A 2/1990 Claussen et al.
5,630,314 A 5/1997 Kojima et al.
(Continued)

FOREIGN PATENT DOCUMENTS

CN 101039877 A 9/2007
CN 101293771 A 10/2008
(Continued)

OTHER PUBLICATIONS

International Preliminary Report on Patentability for International Application No. PCT/US2018/057836, mailed May 7, 2020, 7 Pages.

(Continued)

*Primary Examiner* — Mohammad M Ameen
(74) *Attorney, Agent, or Firm* — Lowenstein Sandler LLP

(57) ABSTRACT

Disclosed are methods of forming a chamber component for a process chamber. The methods may include filling a mold with nanoparticles or plasma spraying nanoparticles, where at least a portion of the nanoparticles include a core particle and a thin film coating over the core particle. The core particle and thin film are formed of, independently, a rare earth metal-containing oxide, a rare earth metal-containing fluoride, a rare earth metal-containing oxyfluoride, or combinations thereof. The nanoparticles may have a donut-shape having a spherical form with indentations on opposite sides. The methods also may include sintering the nanoparticles to form the chamber component and materials. Further described are chamber components and coatings formed from the described nanoparticles.

17 Claims, 3 Drawing Sheets

Related U.S. Application Data continuation of application No. 17/686,053, filed on Mar. 3, 2022, now Pat. No. 11,667,578, which is a division of application No. 16/168,003, filed on Oct. 23, 2018, now Pat. No. 11,279,656.

(60) Provisional application No. 62/578,098, filed on Oct. 27, 2017.

(51) Int. Cl.

| | |
|---|---|
| ***C01F 17/265*** | (2020.01) |
| ***C04B 35/486*** | (2006.01) |
| ***C04B 35/505*** | (2006.01) |
| ***C04B 35/622*** | (2006.01) |
| ***C04B 35/632*** | (2006.01) |
| ***C04B 35/64*** | (2006.01) |
| ***C04B 35/645*** | (2006.01) |
| ***C23C 4/10*** | (2016.01) |
| ***C23C 4/134*** | (2016.01) |
| ***C23C 14/34*** | (2006.01) |
| ***C23C 16/30*** | (2006.01) |
| ***C23C 16/40*** | (2006.01) |
| ***C23C 16/44*** | (2006.01) |
| ***C23C 16/455*** | (2006.01) |

(52) U.S. Cl.

CPC ...... *C04B 35/486* (2013.01); *C04B 35/62222* (2013.01); *C04B 35/62813* (2013.01); *C04B 35/62815* (2013.01); *C04B 35/62823* (2013.01); *C04B 35/62828* (2013.01); *C04B 35/62884* (2013.01); *C04B 35/62889* (2013.01); *C04B 35/62897* (2013.01); *C04B 35/6325* (2013.01); *C04B 35/64* (2013.01); *C04B 35/645* (2013.01); *C23C 4/10* (2013.01); *C23C 4/134* (2016.01); *C23C 14/3414* (2013.01); *C23C 16/30* (2013.01); *C23C 16/405* (2013.01); *C23C 16/4417* (2013.01); *C23C 16/45525* (2013.01); *C23C 16/45555* (2013.01); *C01P 2004/64* (2013.01); *C01P 2004/84* (2013.01); *C04B 2235/3222* (2013.01); *C04B 2235/3224* (2013.01); *C04B 2235/3225* (2013.01); *C04B 2235/3227* (2013.01); *C04B 2235/3244* (2013.01); *C04B 2235/441* (2013.01); *C04B 2235/445* (2013.01); *C04B 2235/52* (2013.01); *C04B 2235/528* (2013.01); *C04B 2235/5454* (2013.01); *C04B 2235/666* (2013.01); *C04B 2235/77* (2013.01); *C04B 2235/96* (2013.01); *C04B 2235/9607* (2013.01)

(56) References Cited

U.S. PATENT DOCUMENTS 5,805,973 A 9/1998 Coffinberry et al.
5,840,434 A 11/1998 Kojima et al.
6,139,983 A 10/2000 Ohashi et al.
6,548,424 B2 4/2003 Putkonen
6,632,549 B1 10/2003 Ohashi et al.
6,641,941 B2 11/2003 Yamada et al.
6,685,991 B2 2/2004 Wataya et al.
6,777,353 B2 8/2004 Putkonen
6,858,332 B2 2/2005 Yamada
6,858,546 B2 2/2005 Niinisto et al.
6,916,534 B2 7/2005 Wataya et al.
7,138,192 B2 11/2006 Yamada et al.
7,351,658 B2 4/2008 Putkonen
7,384,696 B2 6/2008 Hayasaki et al.
7,498,272 B2 3/2009 Niinistö et al.
7,560,376 B2 7/2009 Escher et al.
7,569,280 B2 8/2009 Hayasaki et al.
7,696,117 B2 4/2010 Sun et al.
7,754,621 B2 7/2010 Putkonen
7,780,786 B2 8/2010 Mitsuhashi et al.
7,968,205 B2 6/2011 Nakano et al.
7,998,883 B2 8/2011 Putkonen
8,399,862 B2 3/2013 Ohmi et al.
8,619,406 B2 12/2013 Cho et al.
8,858,745 B2 10/2014 Sun et al.
8,916,021 B2 12/2014 Sun et al.
9,012,030 B2 4/2015 Han et al.
9,090,046 B2 7/2015 Sun et al.
9,343,289 B2 5/2016 Sun et al.
9,394,615 B2 7/2016 Sun et al.
9,440,886 B2 9/2016 Sun et al.
9,551,070 B2 1/2017 Chang et al.
9,617,188 B2 4/2017 Sun et al.
9,617,633 B2 4/2017 He et al.
9,633,884 B2 4/2017 He et al.
11,279,656 B2 3/2022 Zhan et al.
11,667,578 B2* 6/2023 Zhan .................... C04B 35/505 264/319
2002/0177001 A1 11/2002 Harada et al.
2003/0029563 A1 2/2003 Kaushal et al.
2003/0051811 A1 3/2003 Uchimaru et al.
2004/0023811 A1 2/2004 Iijima
2005/0227118 A1 10/2005 Uchimaru et al.
2006/0037536 A1 2/2006 Kobayashi et al.
2006/0073354 A1 4/2006 Watanabe et al.
2007/0179041 A1 8/2007 Muroi et al.
2008/0066647 A1 3/2008 Harada et al.
2008/0213496 A1 9/2008 Sun et al.
2008/0264564 A1* 10/2008 Sun .................. H01J 37/32504 501/134
2008/0264565 A1 10/2008 Sun et al.
2009/0194233 A1 8/2009 Tamura et al.
2010/0104892 A1 4/2010 Kobayashi et al.
2010/0119843 A1 5/2010 Sun et al.
2010/0119844 A1 5/2010 Sun et al.
2010/0129670 A1 5/2010 Sun et al.
2010/0323124 A1 12/2010 Vartabedian et al.
2011/0091700 A1 4/2011 Simpson
2012/0135155 A1 5/2012 Han et al.
2012/0138472 A1 6/2012 Han et al.
2013/0154059 A1 6/2013 Ohmi et al.
2013/0287703 A1 10/2013 Jang et al.
2013/0295272 A1 11/2013 Park et al.
2014/0030486 A1* 1/2014 Sun .................. H01J 37/32495 428/697
2014/0116338 A1 5/2014 He et al.
2014/0120312 A1 5/2014 He et al.
2015/0004418 A1 1/2015 Sun et al.
2015/0010476 A1 1/2015 Schoeffel et al.
2015/0021324 A1 1/2015 Sun et al.
2015/0024155 A1 1/2015 Sun et al.
2015/0061237 A1 3/2015 Sun et al.
2015/0064450 A1 3/2015 Sun et al.
2015/0133285 A1* 5/2015 Sun .................. C04B 35/62655 264/681
2015/0152540 A1 6/2015 Sato et al.
2015/0158775 A1 6/2015 Sun et al.
2015/0299050 A1 10/2015 Sun et al.
2015/0307982 A1 10/2015 Firouzdor et al.
2015/0311043 A1 10/2015 Sun et al.
2015/0311044 A1 10/2015 Sun et al.
2015/0321964 A1 11/2015 Sun et al.
2015/0329955 A1 11/2015 Sun et al.
2016/0079040 A1 3/2016 Park et al.
2016/0181627 A1 6/2016 Roeder et al.
2016/0211121 A1 7/2016 Sun et al.
2016/0273095 A1 9/2016 Lin et al.
2016/0312351 A1 10/2016 Liu et al.
2016/0326625 A1 11/2016 Sun et al.
2016/0326626 A1 11/2016 Sun et al.
2016/0336210 A1 11/2016 Cooke et al.
2016/0375515 A1 12/2016 Xu et al.
2016/0379806 A1 12/2016 Xu et al.
2017/0018408 A1 1/2017 Xu et al.
2017/0022595 A1 1/2017 Sato et al.

(56) References Cited

U.S. PATENT DOCUMENTS

| | | | |
|---|---|---|---|
| 2017/0110293 | A1 | 4/2017 | Sun et al. |
| 2017/0140969 | A1 | 5/2017 | Kuo et al. |
| 2018/0044800 | A1 | 2/2018 | Hendrix et al. |

FOREIGN PATENT DOCUMENTS

| | | | | |
|---|---|---|---|---|
| CN | 101723674 | A | | 6/2010 |
| CN | 105225997 | A | | 1/2016 |
| CN | 105408286 | A | | 3/2016 |
| CN | 106673652 | A | | 5/2017 |
| DE | 3415803 | A1 | | 10/1985 |
| EP | 1412175 | B1 | | 7/2009 |
| EP | 2347031 | A2 | | 7/2011 |
| EP | 2347031 | B1 | | 3/2018 |
| JP | H03115535 | A | | 5/1991 |
| JP | 2006082474 | A | | 3/2006 |
| JP | 2007131951 | A | | 5/2007 |
| JP | 2007217782 | A | | 8/2007 |
| JP | 2013231175 | A | | 11/2013 |
| JP | 2014511260 | A | | 5/2014 |
| JP | 2015514689 | A | | 5/2015 |
| JP | 2017028268 | A | | 2/2017 |
| KR | 20120107060 | A | | 9/2012 |
| KR | 20170009755 | A | | 1/2017 |
| KR | 20170044396 | A | | 4/2017 |
| KR | 20170103043 | A | | 9/2017 |
| WO | 0208186 | A3 | | 3/2002 |
| WO | WO-03/008186 | A1 | * | 1/2003 |
| WO | 2011005631 | A2 | | 1/2011 |
| WO | 2013032260 | A2 | | 3/2013 |
| WO | 2015073458 | A1 | | 5/2015 |
| WO | 2015120265 | A1 | | 8/2015 |

OTHER PUBLICATIONS

International Search Report and Written Opinion for International Application No. PCT/US2018/057836, mailed Feb. 12, 2019, 15 Pages.

Johansson P., et al., "Atomic Layer Deposition Process for Barrier Applications of Flexible Packaging," 2010 Place Conference, Albequerque, New Mexico, Apr. 18-21, 2010, 33 Pages.

Mai L., et al., "Water Assisted Atomic Layer Deposition of Yttrium Oxide Using Tris (N, N'-diisopropyl-2-dimethylamido-guanidinato) yttrium(III): Process Development, Film Characterization and Functional Properties," RSC Advances, Jan. 2018, vol. 8, pp. 4987-4994.

Pilvi T., et al., "ALD of YF3 Thin Films from TiF4 and Y(thd) 3 Precursors," Chemical Vapor Deposition, DE, Mar. 24, 2009, vol. 15, No. 1-3, pp. 27-32, ISSN 0004444270.

Putkonen M., et al., "Low-Temperature ALE Deposition of Y2O3 Thin Films from Beta—Diketonate Precursors," Chemical Vapor Deposition, Verlag GmbH, Weinheim, Germany, 2001, vol. 7, No. 1, pp. 44-50.

Ronn J., "Fabrication and Characterization of Atomic-Layer-Deposited Er2O3 for Optical Amplifier Devices," Master Thesis for Aalto University School of Electrical Engineering, Espoo, Finland, Dec. 1, 2014, 71 Pages.

Rowland J.C., "Atomic Layer Depositions of the Al2O3-Y2O3 Pseudo-Binary System," Doctoral Dissertation, University of Florida, ProQuest LLC, May 2010, 106 Pages.

Shim J. H., et al., "Atomic Layer Deposition of Yttria-Stabilized Zirconia for Solid Oxide Fuel Cells," Chemistry of Materials, 2007, vol. 19, No. 15, pp. 3850-3854.

Tamm A., et al., "Atomic Layer Deposition and Characterization of Zirconium Oxide-erbium Oxide Nanolaminates," Thin Solid Films, Elsevier, Nov. 2010, vol. 519, pp. 666-673.

* cited by examiner

METHODS OF MAKING NANOPOWDERS, NANOCERAMIC MATERIALS AND NANOCERAMIC COMPONENTS

CROSS-REFERENCE TO RELATED APPLICATION(S)

This application is a division of U.S. patent application Ser. No. 18/140,372, filed Apr. 27, 2023, which is a continuation of U.S. patent application Ser. No. 17/686,053, filed on Mar. 3, 2022, which is a division of U.S. patent application Ser. No. 16/168,003 filed on Oct. 23, 2018, which claims the benefit of U.S. Provisional Application No. 62/578,098 filed on Oct. 27, 2017, the contents of which are hereby incorporated by reference in their entirety.

TECHNICAL FIELD

Embodiments herein relate to nanopowders, nanoceramic materials and methods of making and use thereof. The nanopowders contain nanoparticles having a core particle with a thin film coating. The core particles and thin film coatings are, independently, formed from at least one of a rare earth metal-containing oxide, a rare earth metal-containing fluoride, a rare earth metal-containing oxyfluoride or combinations thereof. The thin film coating may be formed using a non-line of sight technique such as atomic layer deposition (ALD).

BACKGROUND

Various semiconductor manufacturing processes use high temperatures, high energy plasma, a mixture of corrosive gases, high stress, and combinations thereof. These extreme conditions expose components inside of the processing chamber to plasma irradiation, which leads to process drift and particle generation. For example, a fluorine-based plasma used for dry etching and cleaning processes may cause fluorination of a component's surface. Components within the chamber commonly contain alumina, which has severe erosion and particle generation issues for nanometer scale device fabrication.

Protective coatings are typically deposited on chamber components by a variety of methods, such as thermal spray, sputtering, plasma spray or evaporation techniques. However, such coatings can have inadequate mechanical properties (e.g., flexural strength and fracture toughness) for semiconductor processing. Such coatings ordinarily have a microcrystalline structure.

SUMMARY

Described in embodiments herein is a nanopowder comprising a plurality of nanoparticles, wherein at least a portion of the plurality of nanoparticles comprises a core particle comprising a first material selected from a group consisting of a rare earth metal-containing oxide, a rare earth metal-containing fluoride, a rare earth metal-containing oxyfluoride and combinations thereof; and a thin film coating over the core particle, the thin film coating comprising a second material selected from a group consisting of a rare earth metal-containing oxide, a rare earth metal-containing fluoride, a rare earth metal-containing oxyfluoride and combinations thereof.

Described in further embodiments herein is a method comprising performing atomic layer deposition to form a plurality of nanoparticles, comprising forming a thin film coating over core particles, wherein the core particles comprise a first material selected from a group consisting of a rare earth metal-containing oxide, a rare earth metal-containing fluoride, a rare earth metal-containing oxyfluoride and combinations thereof; and wherein the thin film coating comprises a second material selected from a group consisting of a rare earth metal-containing oxide, a rare earth metal-containing fluoride, a rare earth metal-containing oxyfluoride and combinations thereof.

Described in further embodiments herein is a method of forming a nanoceramic component comprising: (a) filling a mold with a plurality of nanoparticles, wherein at least a portion of the plurality of nanoparticles comprises: a core particle comprising a first material selected from a group consisting of a rare earth metal-containing oxide, a rare earth metal-containing fluoride, a rare earth metal-containing oxyfluoride and combinations thereof; and a thin film coating over the core, the thin film coating comprising a second material selected from a group consisting of a rare earth metal-containing oxide, a rare earth metal-containing fluoride, a rare earth metal-containing oxyfluoride and combinations thereof; and (b) sintering the plurality of nanoparticles to form the nanoceramic component.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION

Embodiments described herein relate to nanopowders, nanoceramic materials and methods of preparation and use thereof, wherein the nanopowders comprise nanoparticles at least a portion of which each has a core particle coated with a thin film. The core particle and thin film coating are comprised of different materials independently selected from at least one of a rare earth metal-containing oxide, a rare earth metal-containing fluoride or a rare earth metal-containing oxyfluoride.

Figure 1:
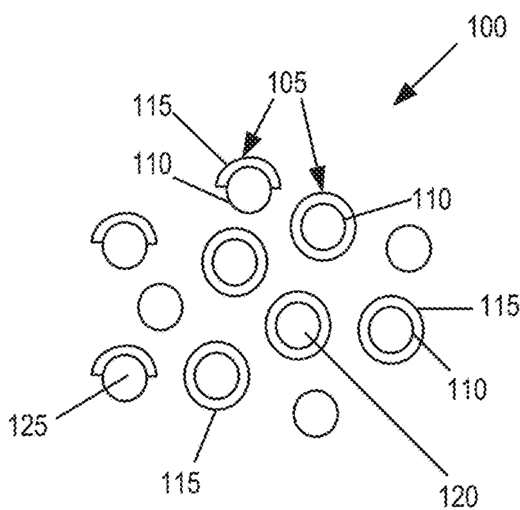
FIG. 1 depicts a nanopowder formed during an atomic layer deposition process in accordance with embodiments described herein.

FIG. 1 is a representation of a nanopowder 100 comprising a plurality of nanoparticles 105 in accordance with embodiments described herein. As shown in FIG. 1, at least a portion of the nanoparticles each include a core particle 110 and a thin film coating 115 on the core particle. In certain embodiments, the core particles 110 of the nanoparticles 105 are formed from a powder containing a first material selected from a rare earth metal-containing oxide, a rare earth metal-containing fluoride, a rare earth metal-containing oxyfluoride or combinations thereof. In certain embodiments, the size of the core particles 110 is from about 5 nm to about 100 nm, or about 10 nm to about 90 nm, or about 20 nm to about 80 nm, or about 30 nm to about 70 nm. In some embodiments, the size of the core particles is about 5 nm, or about 10 nm, or about 20 nm, or about 30 nm, or less than about 100 nm.

Note that embodiments are described herein with reference to nanoparticles. However, it should be understood that embodiments also work with microparticles having sizes on the scale of about 1-100 microns.

In certain embodiments, the thin film coatings 115 on the core particles 110 are formed of a second material selected from a rare earth metal-containing oxide, a rare earth metal-containing fluoride, a rare earth metal-containing oxyfluoride or combinations thereof. The second material of the thin film coating 115 is different from the first material of the core particles 110. In certain embodiments, the thickness of the thin film coating 115 may be about 1 nm to about 500 nm, or about 1 nm to about 250 nm, or about 1 nm to about 100 nm, or about 1 nm to about 50 nm, or about 1 nm to about 25 nm, or about 1 nm to about 10 nm, or about 1 nm to about 5 nm, or about 30 nm to about 40 nm, or about 3 nm to about 5 nm. In some embodiments, the thickness of the thin film coating may be about 1 nm, or about 3 nm, or about 4 nm, or about 5 nm, or about 10 nm, or about 25 nm, or about 50 nm, or about 100 nm. In embodiments, the thin film coating 115 has a density of about 1 g/cm$^3$ to about 20 g/cm$^3$, or about 2 g/cm$^3$ to about 15 g/cm$^3$, or about 3 g/cm$^3$ to about 10 g/cm$^3$, or about 4 g/cm$^3$ to about 7 g/cm$^3$. In some embodiments, the density of the thin film coating 115 is about 1 g/cm$^3$, or about 2 g/cm$^3$, or about 3 g/cm$^3$, or about 4 g/cm$^3$, or about 5 g/cm$^3$, or about 6 g/cm$^3$, or about 7 g/cm$^3$. The nanoparticles 105 in the nanopowder 100 according to embodiments described herein are from about 5 nm to about 600 nm, or about 10 nm to about 300 nm, or about 25 nm to about 250 nm, or about 50 nm to about 100 nm.

As shown in FIG. 1, at least a portion of the nanoparticles 105 in the nanopowder 100 have a thin film coating 115. In some embodiments, at least a portion of the nanoparticles are completely coated with the thin film coating 120. In some embodiments, at least a portion of the nanoparticles may be partially coated with the thin film coating 125. In certain embodiments, at least about 5%, or about 10%, or about 25%, or about 50%, or about 75%, or about 90%, or about 95% of the nanoparticles 105 in the nanopowder 100 are at least partially coated. In certain embodiments, at least about 5%, or about 10%, or about 25%, or about 50%, or about 75%, or about 90%, or about 95% of the nanoparticles 105 in the nanopowder 100 are completely coated with the thin film coating.

The first material of the core particles 110 and the second material of the thin film coatings 115 are independently selected from a rare earth metal-containing oxide, a rare earth metal-containing fluoride, a rare earth metal-containing oxyfluoride and combinations thereof. Although the first material and the second material may contain common elements, the first material differs from the second material.

The rare earth metal in the first material and/or the second material may be selected from yttrium, erbium, lanthanum, lutetium, scandium, gadolinium, samarium and/or dysprosium. Examples of rare earth metal containing oxides include, but are not limited to, yttria ($Y_2O_3$), erbium oxide ($Er_2O_3$),), dysprosium oxide ($Dy_2O_3$), gadolinium oxide ($Gd_2O_3$), scandium oxide ($Sc_2O_3$), combinations thereof and so on. Examples of rare earth metal containing fluorides include, but are not limited to, yttrium fluoride ($YF_3$), erbium fluoride ($ErF_3$), dysprosium fluoride ($DyF_3$), gadolinium fluoride ($GdF_3$), scandium fluoride ($ScF_3$), combinations thereof and so on. Examples of rare earth metal-containing oxyfluorides include, but are not limited to, yttrium oxyfluoride ($Y_xO_yF_z$ or YOF), erbium oxyfluoride ($Er_xO_yF_z$), dysprosium fluoride ($DyF_3$), dysprosium oxyfluoride ($Dy_xO_yF_z$), gadolinium oxyfluoride ($Gd_xO_yF_z$), scandium oxyfluoride ($Sc_xO_yF_z$), combinations thereof and so on.

In certain embodiments, the core particles 110 and/or the thin film coatings 115 may include at least one of $Y_2O_3$, $Y_3Al_5O_{12}$ (YAG), $Y_4Al_2O_9$ (YAM), $YF_3$, YOF, $Er_2O_3$, $Er_3Al_5O_{12}$ (EAG), $ErF_3$, EOF, $La_2O_3$, $Lu_2O_3$, $Sc_2O_3$, $ScF_3$, ScOF, $Gd_2O_3$, $Sm_2O_3$ or $Dy_2O_3$. The core particles 110 and/or the thin film coatings 115 may also be $YAlO_3$ (YAP), $Er_4Al_2O_9$ (EAM), $ErAlO_3$ (EAP) or other ternary variants of lanthanum, lutetium, scandium, gadolinium, samarium or dysprosium. Any of the aforementioned rare earth metal-containing materials may include trace amounts of other materials such as $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$ and/or other oxides.

In some embodiments, the nanopowder 100 containing the plurality of nanoparticles 105 contains about 40 mol % to about 90 mol %, or about 50 mol % to about 80 mol %, or about 60 mol % to about 70 mol % yttrium oxide and about 10 mol % to about 60 mol %, or about 20 mol % to about 50 mol % or about 30 mol % to about 40 mol % zirconium oxide. In certain embodiments, the nanopowder 100 containing the plurality of nanoparticles 105 contains about 60 mol % to about 70 mol % yttrium oxide and about 30 mol % to about 40 mol % zirconium oxide. In some embodiments the core particles 110 are zirconium oxide and the thin film coatings 115 are yttrium oxide. In some embodiments the core particles 110 are yttrium oxide and the thin film coatings 115 are zirconium oxide. In some embodiments, the ratio of the rare earth metal-containing oxide, rare earth metal-containing fluoride, rare earth metal-containing oxyfluoride or combination thereof in the core to the rare earth metal-containing oxide, rare earth metal-containing fluoride, rare earth metal-containing oxyfluoride or combination thereof in the thin film coating may be about 1:100 to about 100:1, or about 1:75 to about 75:1, or about 1:50 to about 50:1, or about 1:35 to about 35:1, or about 1:20 to about 20:1, or about 1:15 to about 15:1, or about 1:10 to about 10:1, or about 1:5 to about 5:1, or about 1:100 to about 35:1.

In certain embodiments where the core particle is formed of $ZrO_2$ and has a size of about 100 nm and the thin film coating is formed of $Y_2O_3$ at a varying thickness, the concentrations (in Mole %) of each component may be as shown in Table 1. Similarly, Table 1 shows the concentrations of each component where the core particle is formed of $Y_2O_3$ and has a size of about 100 nm and the thin film coating is formed of $ZrO_2$ at a varying thickness.

TABLE 1

Molar concentrations for nanoparticles according to embodiments

| Particle (Sphere) in nm | | Volume (cm3) | | Weight (g) | | Mole mass | | Mole % | |
|---|---|---|---|---|---|---|---|---|---|
| ZrO2 core | Y2O3 shell | ZrO2 core | Y2O3 shell | ZrO2 core | Y2O3 shell | ZrO2 core | Y2O3 shell | ZrO2 | Y2O3 |
| 100 | 1 | 5.24E−16 | 3.20E−17 | 2.97E−15 | 1.61E−16 | 2.41E−17 | 7.11E−19 | 97 | 3 |
| 100 | 5 | 5.24E−16 | 1.73E−16 | 2.97E−15 | 8.68E−16 | 2.41E−17 | 3.85E−18 | 86 | 14 |
| 100 | 10 | 5.24E−16 | 3.81E−16 | 2.97E−15 | 1.91E−15 | 2.41E−17 | 8.46E−18 | 74 | 26 |
| 100 | 20 | 5.24E−16 | 9.13E−16 | 2.97E−15 | 4.57E−15 | 2.41E−17 | 2.03E−17 | 54 | 46 |
| 100 | 30 | 5.24E−16 | 1.62E−15 | 2.97E−15 | 8.12E−15 | 2.41E−17 | 3.61E−17 | 40 | 60 |
| 100 | 35 | 5.24E−16 | 2.05E−15 | 2.97E−15 | 1.03E−14 | 2.41E−17 | 4.55E−17 | 35 | 65 |
| 100 | 40 | 5.24E−16 | 2.53E−15 | 2.97E−15 | 1.27E−14 | 2.41E−17 | 5.61E−17 | 30 | 70 |
| 100 | 50 | 5.24E−16 | 3.67E−15 | 2.97E−15 | 1.84E−14 | 2.41E−17 | 8.13E−17 | 23 | 77 |
| 100 | 70 | 5.24E−16 | 6.71E−15 | 2.97E−15 | 3.36E−14 | 2.41E−17 | 1.49E−16 | 14 | 86 |
| 100 | 100 | 5.24E−16 | 1.36E−14 | 2.97E−15 | 6.82E−14 | 2.41E−17 | 3.02E−16 | 7 | 93 |
| 100 | 1 | 5.24E−16 | 3.20E−17 | 2.62E−15 | 1.82E−16 | 1.16E−17 | 1.48E−18 | 11 | 89 |
| 100 | 2 | 5.24E−16 | 6.54E−17 | 2.62E−15 | 3.71E−16 | 1.16E−17 | 3.01E−18 | 21 | 79 |
| 100 | 3 | 5.24E−16 | 1.00E−16 | 2.62E−15 | 5.68E−16 | 1.16E−17 | 4.61E−18 | 28 | 72 |
| 100 | 4 | 5.24E−16 | 1.36E−16 | 2.62E−15 | 7.72E−16 | 1.16E−17 | 6.27E−18 | 35 | 65 |
| 100 | 5 | 5.24E−16 | 1.73E−16 | 2.62E−15 | 9.84E−16 | 1.16E−17 | 7.99E−18 | 41 | 59 |
| 100 | 10 | 5.24E−16 | 3.81E−16 | 2.62E−15 | 2.17E−16 | 1.16E−17 | 1.76E−17 | 60 | 40 |
| 100 | 20 | 5.24E−16 | 9.13E−16 | 2.62E−15 | 5.19E−16 | 1.16E−17 | 4.21E−17 | 78 | 22 |
| 100 | 30 | 5.24E−16 | 1.62E−15 | 2.62E−15 | 9.21E−16 | 1.16E−17 | 7.47E−17 | 87 | 13 |
| 100 | 35 | 5.24E−16 | 2.05E−15 | 2.62E−15 | 1.16E−16 | 1.16E−17 | 9.45E−17 | 89 | 11 |
| 100 | 40 | 5.24E−16 | 2.53E−15 | 2.62E−15 | 1.44E−16 | 1.16E−17 | 1.17E−16 | 91 | 9 |
| 100 | 50 | 5.24E−16 | 3.67E−15 | 2.62E−15 | 2.08E−16 | 1.16E−17 | 1.69E−16 | 94 | 6 |
| 100 | 70 | 5.24E−16 | 6.71E−15 | 2.62E−15 | 3.81E−16 | 1.16E−17 | 3.10E−16 | 96 | 4 |
| 100 | 100 | 5.24E−16 | 1.36E−14 | 2.62E−15 | 7.73E−16 | 1.16E−17 | 6.28E−16 | 98 | 2 |

With reference to Table 1, in certain embodiments, to achieve a composition having a ratio of $Y_2O_3$ (thin film coating) to $ZrO_2$ (core particle) of about 60 Mole % to about 70 Mole %, the thickness of the $Y_2O_3$ thin film coating (i.e., the "shell") should be in the range of about 30 nm to about 40 nm. Likewise, for a $Y_2O_3$ core particle of about 100 nm, in certain embodiments, to achieve a composition having a ratio of $Y_2O_3$ (core particle) to $ZrO_2$ (thin film coating) of about 60 Mole % to about 70 Mole %, the thickness of the $ZrO_2$ thin film coating is in the range of about 3 nm to about 5 nm.

Figure 2:
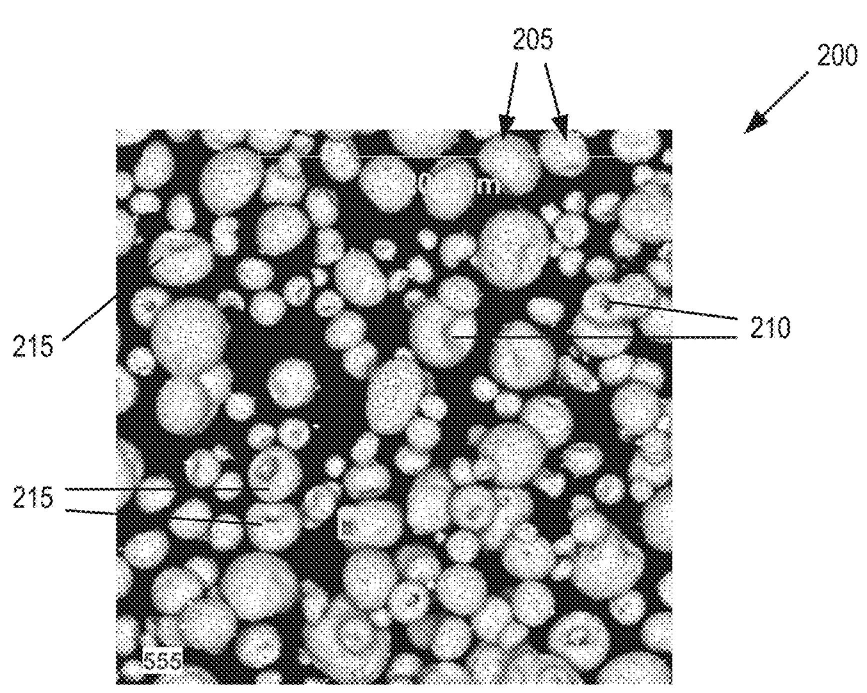
FIG. 2 depicts a nanopowder formed during an atomic layer deposition process in accordance with embodiments described herein.

FIG. 2 depicts nanoparticles 205 in a nanopowder 200 in accordance with at least one embodiment described herein. At least a portion of the nanoparticles 205 may have a spherical shape with deep indentions 210 on opposite sides of the sphere. In other words, some nanoparticles 205 may have a donut shape 215. Without being bound to any particular theory, it is believed that in some embodiments, nanocoatings formed from a nanopowder 200 with nanoparticles 205 having a donut shape 215 may have improved morphology and porosity as compared to nanocoatings formed with nanoparticles of other shapes. For example, nanocoatings formed of nanoparticles 205 having a donut shape 215 may have fewer nodules and splats due to improved melting of the nanopowder, decreased roughness, and decreased porosity, all of which contribute to improved on-wafer particle performance.

Nanopowders having a plurality of nanoparticles in accordance with embodiments described herein, may be formed using atomic layer deposition (ALD). ALD allows for a controlled self-limiting deposition of material through chemical reactions with the surface of a substrate (e.g., a starting material of core particles). Aside from being a conformal process, ALD is also a uniform process and is capable of forming very thin films, for example, having a thickness of about 1 nm or more. All exposed surfaces of the core particles will have the same or approximately the same amount of material deposited. A typical reaction cycle of an ALD process starts with a precursor (i.e., a single chemical A) flooded into an ALD chamber and adsorbed onto exposed surfaces of the core particles. The excess precursor is then flushed out of the ALD chamber before a reactant (i.e., a single chemical R) is introduced into the ALD chamber and subsequently flushed out. For ALD, the final thickness of material is dependent on the number of reaction cycles that are run, because each reaction cycle will grow a layer of a certain thickness that may be one atomic layer or a fraction of an atomic layer. The ALD technique can deposit a thin layer of material at a relatively low temperature (e.g., about 25° C. to about 350° C.) so that it does not damage the starting material.

ALD is particularly useful for forming rare earth metal-containing nanopowders as described herein. Conventional line-of-sight deposition methods would produce thicker coatings over the core particles than those deposited by ALD. Indeed, such conventional methods could cause agglomeration resulting in micron size particles. Such particles are too large to use in nanoscale device fabrication. Thus, an achievement of some embodiments herein is to apply a thin film coating to core particles to produce a nanopowder comprising a plurality of nanoparticles that is resistant to the harsh plasma and reactant conditions in a processing chamber. Such nanopowders can be used, for example, to form targets for ion assisted deposition sputtering devices, as a base material for plasma spray processes or to form nanoceramic components (e.g., filling a mold for a component with the nanopowder and sintering the nanopowder to form a nanoceramic component).

The thin film coatings on the core particles described herein may be formed using ALD with a rare earth metal-containing precursor and one or more reactants consisting of or containing oxygen and/or fluorine. Suitable oxygen-reactants to form a metal oxide layer may be oxygen, water vapor, ozone, pure oxygen, oxygen radicals, or another oxygen source. Suitable fluoride-reactants to form a metal fluoride layer may be, for instance, a fluoride (e.g., $TiF_4$, HF) or another fluorine source.

The rare earth metal-containing precursor may include, but is not limited to, yttrium, erbium, lanthanum, lutetium, scandium, gadolinium, samarium or dysprosium. Examples of suitable yttrium precursors include, but are not limited to, tris(N,N-bis(trimethylsilyl)amide)yttrium (III) or yttrium (III) butoxide and the corresponding reactant may be $O_2$, $H_2O$ or $O_3$. Examples of suitable erbium precursors include, but are not limited to, tris-methylcyclopentadienyl erbium (III) ($Er(MeCp)_3$), erbium boranamide ($Er(BA)_3$), $Er(TMHD)_3$, erbium(III)tris(2,2,6,6-tetramethyl-3,5-heptanedionate), or tris(butylcyclopentadienyl)erbium(III) and the corresponding reactant may be $O_2$, $H_2O$ or $O_3$.

Various types of ALD processes exist and the specific type may be selected based on several factors such as the substrate to be coated, the coating material, chemical interaction between the surface and the coating material, etc. The general principle for the various ALD processes comprises growing a thin film layer by repeatedly exposing the surface to be coated to pulses of gaseous chemical precursors that chemically react with the surface one at a time in a self-limiting manner.

In an example embodiment, a first process for forming a rare earth metal-containing oxyfluoride thin film coating may include performing x atomic layer deposition (ALD) cycles to form a first rare earth oxide layer on a core particle. The process may further include performing y ALD cycles to form a first rare earth fluoride thin film layer on the first rare earth oxide thin film layer. The first rare earth oxide layer and the first rare earth fluoride layer may compirse the same rare earth metal. The process may further include diffusing, in-situ, at least one of fluorine from the first rare earth fluoride layer into the first rare earth metal-containing oxide layer or oxygen from the first rare earth metal-containing oxide layer into the first rare earth metal-containing fluoride layer to form a first rare earth metal-containing oxyfluoride thin film coating. The first rare earth oxyfluoride thin film coating may have a molar oxygen to fluorine ratio of that is based on x and y.

In an example embodiment, a second process for forming a rare earth oxyfluoride thin film coating on a core particle may include performing an ALD cycle to form a first rare earth oxyfluoride layer on a surface of a core particle. The first rare earth oxyfluoride layer may have a target molar oxygen to fluorine ratio. The ALD cycle may include forming a first adsorption layer of a rare earth metal onto the surface of the core particle by injecting a rare earth metal-containing precursor into a deposition chamber containing the core particles. The ALD cycle may further include reacting at least one oxygen-containing reactant and one fluorine-containing reactant with the first adsorption layer by co-injecting at least one oxygen-containing reactant at a first dose rate and at least one fluorine containing reactant at a second dose rate into the deposition chamber.

In an example embodiment, a third process for forming a rare earth oxyfluoride thin film coating on a core particle may include performing z ALD cycles to form a first rare earth metal-containing oxide layer on a surface of a core particle. The process may further include exposing the core particle to fluorine containing species. The process may further include converting the first rare earth metal-containing oxide layer into a first rare earth metal-containing oxyfluoride thin film coating. The process may further include performing at least one additional ALD cycle to form an additional rare earth oxide layer. The process may further include exposing the core particle to fluorine containing species. The process may further include converting the additional rare earth metal-containing oxide layer into an additional rare earth metal-containing oxyfluoride thin film coating. These processes may be repeated to form further rare earth oxyfluoride layers until a target thickness is reached.

Figures 3A, 3B:
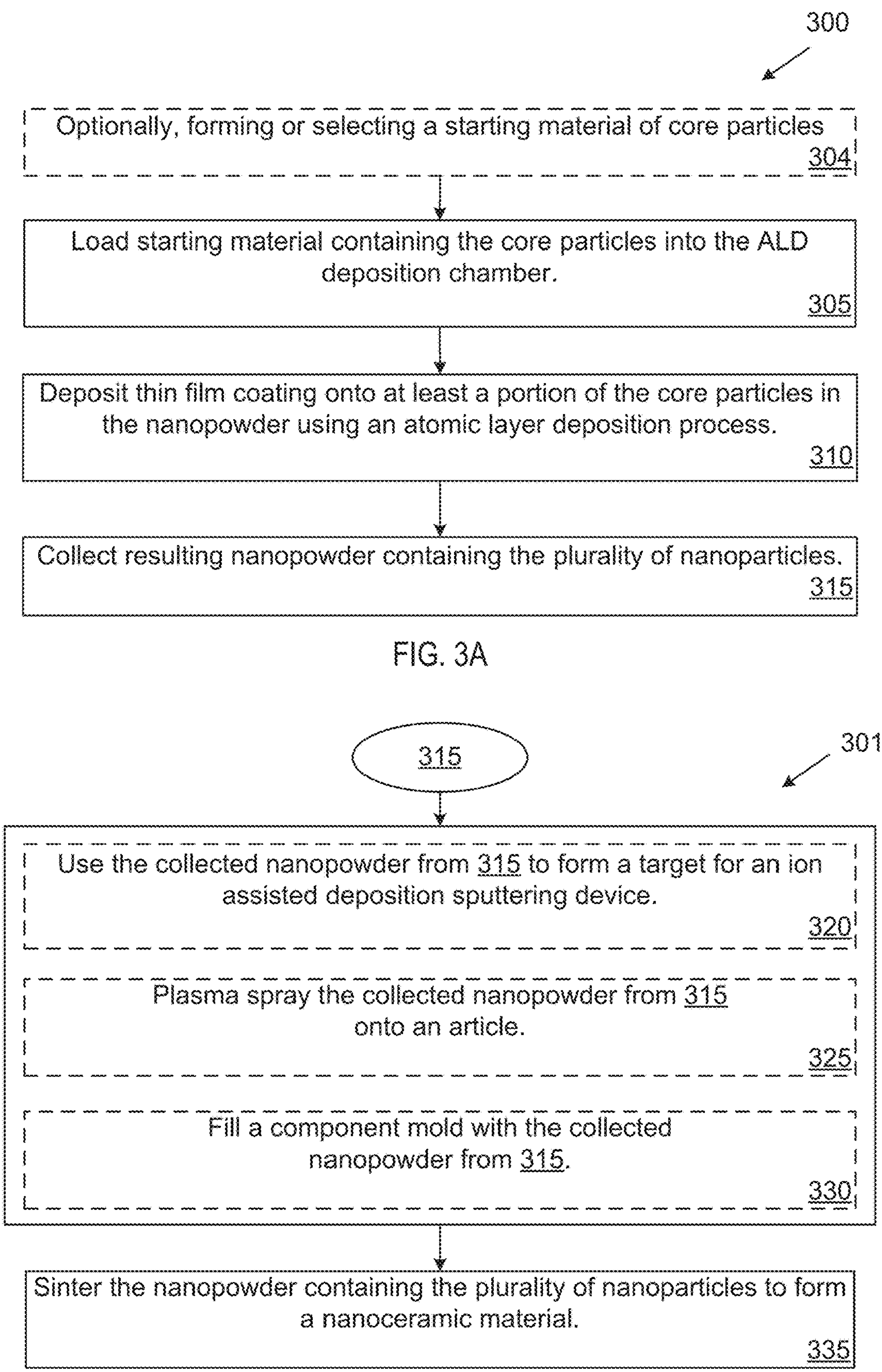
FIG. 3A illustrates a method for preparing a nanopowder using atomic layer deposition in accordance with embodiments described herein.
FIG. 3B illustrates methods of using a nanopowder in accordance with embodiments described herein.

FIG. 3A illustrates a method 300 for preparing a nanopowder comprising a plurality of nanoparticles according to embodiments. At block 304, the method 300 may optionally begin by selecting a starting material for the core particles or by forming the starting material using a reverse strike co-precipitation process to control particle size distribution known to those of ordinary skill in the art. Selecting or forming the starting material may be performed by the same entity that forms the nanopowder by ALD or by a different entity. In some embodiments, the core particles in the starting material may be pure yttrium oxide, pure zirconium oxide or a composite of yttrium oxide and zirconium oxide at about 60 mol % to about 70 mol % yttrium oxide and about 30 mol % to about 40 mol % zirconium oxide.

At block 305, the starting material containing the core particles is loaded into an ALD deposition chamber. For example, the core particles may be in the form of a powder that is introduced into the reaction chamber using various methods known to those of ordinary skill in the art.

At block 310, the method 300 includes depositing a thin film coating on at least a portion of the core particles using ALD. Surface reactions (e.g., half-reactions) are performed sequentially, and the precursors and reactants are not in contact in embodiments. Prior to introduction of a precursor or reactant, the chamber in which the ALD process takes place may be purged with an inert carrier gas (such as nitrogen or air) to remove any unreacted precursor and/or surface-precursor reaction byproducts. ALD processes may be conducted at various temperatures depending on the type of process. The optimal temperature range for a particular ALD process is referred to as the "ALD temperature window." Temperatures below the ALD temperature window may result in poor growth rates and non-ALD type deposition. Temperatures above the ALD temperature window may result in reactions taken place via a chemical vapor deposition (CVD) mechanism. The ALD temperature window may range from about 100° C. to about 650° C. In some embodiments, the ALD temperature window is from about 20° C. to about 200° C., or about 25° C. to about 150° C., or about 100° C. to about 120° C., or about 20° C. to 125° C.

The ALD process can provide a conformal thin film coating having uniform thickness on core particles. Sufficient exposure time of the precursor to the surfaces of the core particles enables the precursor to disperse and fully react with the core particles. Additionally, the ALD technique is advantageous over other commonly used coating techniques because it allows in-situ, on demand material synthesis of a particular composition or formulation without a lengthy and difficult fabrication of source materials (such as powder feedstock and sintered targets).

The thin film coating may have a thickness of about 1 nm to about 500 nm, or about 1 nm to about 250 nm, or about 1 nm to about 100 nm, or about 1 nm to about 50 nm, or about 1 nm to about 25 nm, or about 1 nm to about 10 nm, or about 1 nm to about 5 nm. In some embodiments, the thickness of the thin film coating may be about 1 nm, or about 5 nm, or about 25 nm, or about 50 nm, or about 100 nm. In some embodiments, the ratio of the rare earth metal-containing oxide, rare earth metal-containing fluoride, rare earth metal-containing oxyfluoride or combination thereof in the core to the rare earth metal-containing oxide, rare earth metal-containing fluoride, rare earth metal-containing oxyfluoride or combination thereof in the thin film coating may be about 1:100 to about 100:1, or about 1:75 to about 75:1, or about 1:50 to about 50:1, or about 1:35 to about 35:1, or about 1:20 to about 20:1, or about 1:15 to about 15:1, or about 1:10 to about 10:1, or about 1:5 to about 5:1, or about 1:100 to about 35:1. In some embodiments, at least about 90%, or at least about 80%, or at least about 70%, or at least about 60%, or at least about 50%, or at least about 40%, or at least about 30%, or at least about 20%, or at least about 10%, or at least about 5%, or at least about 1% of the core particles in the nanopowder are coated with the thin film. For individual nanoparticles, the thin film coating may cover the entire core particle or only a portion of the core particle (e.g., about 90%, or about 80%, or about 70%, or about 60%, or about 50%, or about 40%, or about 30%, or about 20%, or about 10%, or about 5%, or about 1%).

At block 315, the resulting nanopowder containing the plurality of nanoparticles is collected. The nanoparticles in the nanopowder may be about 5 nm to about 600 nm, or about 10 nm to about 300 nm, or about 25 nm to about 250 nm, or about 50 nm to about 100 nm. The nanoparticles may be spherical and rounded on all sides or, in some embodiments, may have a donut shape as described above. In some embodiments, the ratio by weight of the rare earth metal-containing oxide, rare earth metal-containing fluoride, rare earth metal-containing oxyfluoride or combination thereof in the core particle to the rare earth metal-containing oxide, rare earth metal-containing fluoride, rare earth metal-containing oxyfluoride or combination thereof in the thin film coating is about 1:100 to about 100:1, or about 1:75 to about 75:1, or about 1:50 to about 50:1, or about 1:35 to about 35:1, or about 1:20 to about 20:1, or about 1:15 to about 15:1, or about 1:10 to about 10:1, or about 1:5 to about 5:1, or about 1:100 to about 35:1.

FIG. 3B illustrates methods 301 of using the nanopowder formed in the method 300. The nanopowder collected from the ALD chamber at block 315 may be used in a variety of different ways. In one example, at block 320, the nanopowder may be used to form a sputtering target for an ion assisted deposition (IAD) process. The nanopowder may be used to form a protective coating an article using an IAD process. The material source would be a target formed from the nanopowder that provides a flux of deposition material while an energetic particle source provides a flux of energetic particles (i.e., nanoparticles from the target), both of which impinge upon the article throughout the IAD process. The target used to provide the deposition materials may be a bulk sintered ceramic formed from nanopowders as described herein. Embodiments may utilize one or more plasmas or beams to provide the deposition material and energetic ion sources. Reactive species may also be provided during deposition of the protective coating. With IAD processes, the energetic particles may be controlled by the energetic ion (or other particle) source independently of other deposition parameters. According to the energy (e.g., velocity), density and incident angle of the energetic ion flux, composition, structure, crystalline orientation and grain size of the protective coating on the article may be manipulated. Additional parameters that may be adjusted are temperature of the article during deposition as well as the duration of the deposition. The ion energy may be roughly categorized into low energy ion assist and high energy ion assist. The ions are projected with a higher velocity with high energy ion assist than with low energy ion assist.

In another example, at block 325, the nanopowder may be plasma sprayed onto an article. For example, the nanopowder may be plasma sprayed onto articles including, but not limited to, chamber walls, shower heads, nozzles, plasma generation units (e.g., radiofrequency electrodes with housings), diffusers and gas lines. The article may be roughened prior to plasma spraying the nanopowder onto it to form a coating. The roughening may be performed, for example, by bead blasting the article. Roughening the article provides anchor points to create a mechanical bond between the plasma sprayed nanopowder and surfaces of the article for better adhesion. The resulting coating formed from the plasma sprayed nanopowder may have an as sprayed thickness of up to about 200 microns or thicker, and may be ground down to a final thickness of about 50 microns in some embodiments. A plasma sprayed nanopowder coating may have a porosity of about 2% to about 4%.

In another example, at block 330, a mold for a component may be filled with the nanopowder and subsequently formed into a nanoceramic component (e.g., via sintering).

At block 335, the nanopowder containing the plurality of nanoparticles may be sintered to form a nanoceramic material. Sintering is a method of forming bulk materials from powders using heat, pressure and/or energy. In some embodiments, the plurality of nanoparticles are sintered by applying a temperature of about 2730° F. to about 3275° F. and/or a pressure of about 25 MPa to about 1 GPa. The powders can be a variety of materials (e.g., metals, ceramics, etc.) having particles at a variety of sizes ranging from nanometers to micrometers. The powders may be a single phase or more complex with two or more components.

Examples of sintering techniques include, but are not limited to, pressureless sintering, spark plasma sintering, and high pressure sintering. In embodiments, the nanopowder is sintered using a Spark Plasma Sintering process (SPS). SPS is a pressure assisted fast sintering method that uses a high-temperature plasma (i.e., a spark plasma), which is momentarily generated in the gas between powder materials by electrical discharge during on-and-off direct current (DC) pulsing. The DC current may generate several effects including the spark plasma, a spark impact pressure, Joule heating and an electrical field diffusion effect. Through these effects, SPS can rapidly consolidate powers to near-theoretical density through the combined effects of rapid heating, pressure and powder surface cleaning.

In other embodiments, the nanopowder is sintered using an Enhanced Pressure Assisted Sintering process (EPAS). EPAS utilizes a pressure-assisted sintering approach, but incorporates stringent environmental control at all steps of nanopowder processing and during sintering so that the nanoparticle surfaces are clean and without adsorbates, additives, or sintering aids. The clean nanoparticle surfaces are intrinsically in a high potential state where the surface's energy is maximized and diffusional mechanisms involved in densification are enhanced. The coupling of pressure effects (increased rate of densification, etc.) and highly active nanoparticle surfaces promotes high rates of densification with controlled coarsening. This allows the creation of materials with structures, compositions and properties not obtained before, materials in the submicron or nano-scales and composites with unique/unusual compositions/performance. EPAS can be used to effectively retard coarsening mechanisms such that the crystallite size of the nanopowder is retained.

Sintering transforms the nanopowder into a nanoceramic material. The nanoceramic material may comprise, for example, a compound selected from $Y_3Al_5O_{12}$ (YAG), $Y_4Al_2O_9$ (YAM), $YAlO_3$ (YAP), $Y_2O_3$—$ZrO_2$ solid solution, $Er_3Al_5O_{12}$ (EAG), $Er_4Al_2O_9$ (EAM) and $ErAlO_3$ (EAP). In embodiments, the resulting nanoceramic material may be resistant to fluorine and hydrogen plasmas used during semiconductor manufacturing processes. The nanoceramic material may have a density of about 1 g/cm$^3$ to about 10 g/cm$^3$, or about 2 g/cm$^3$ to about 8 g/cm$^3$, or about 3 g/cm$^3$ to about 6 g/cm$^3$, or about 5 g/cm$^3$ to about 6 g/cm$^3$ or about 3 g/cm$^3$, or about 4 g/cm$^3$, or about 5 g/cm$^3$, or about 5.25 g/cm$^3$, or about 6 g/cm$^3$. The flexural strength of the resulting nanoceramic material may be about 170 MPA to about 250 MPA, or about 190 MPA to about 230 MPA, or about 200 MPA to about 225 MPA. The modulus of elasticity of the resulting nanoceramic material may be about 100 GPA to about 300 GPA, or about 150 GPA to about 275 GPA, or about 195 GPA to about 250 GPA. The Vickers hardness of the resulting nanoceramic material may be about 1 GPA to about 50 GPA, or about 5 GPA to about 25 GPA, or about 9 GPA to about 20 GPA, or about 9.4 GPA to about 18 GPA. The fracture toughness of the resulting nanoceramic material may be about 0.1 Mpam$^{1/2}$ to about 5.0 Mpam$^{1/2}$, or about 0.5 Mpam$^{1/2}$ to about 4.0 Mpam$^{1/2}$, or about 1.1 Mpam$^{1/2}$ to about 3.0 Mpam$^{1/2}$. The coefficient of thermal expansion (RT-800C) of the resulting nanoceramic material may be about $1.0\times10^6$ to about $15\times10^6$, or about $5.0\times10^6$ to about $10\times10^6$, or about $8.3\times10^6$ to about $9.5\times10^6$. The volumetric resistivity of the resulting nanoceramic material may be about $1.0\times10^{16}$ Ohm-cm to about $10\times10^{16}$ Ohm-cm, or about $2.0\times10^{16}$ Ohm-cm to about $8.0\times10^{16}$ Ohm-cm, or about $4.0\times10^{16}$ Ohm-cm to about $6.0\times10^{16}$ Ohm-cm. The dielectric constant at 13.56 MHz of the resulting nanoceramic material may be about 5 to about 25, or about 10 to about 20, or about 15 to about 16.5. The dielectric loss tangent at 13.56 MHz may be less than about $10\times10^4$. The thermal conductivity of the resulting nanoceramic material may be about 1.0 W/mK to about 15 W/mK, or about 2.5 W/mK to about 10.0 W/mK, or about 3.6 W/mK to about 5.0 W/mK.

Figure 4:
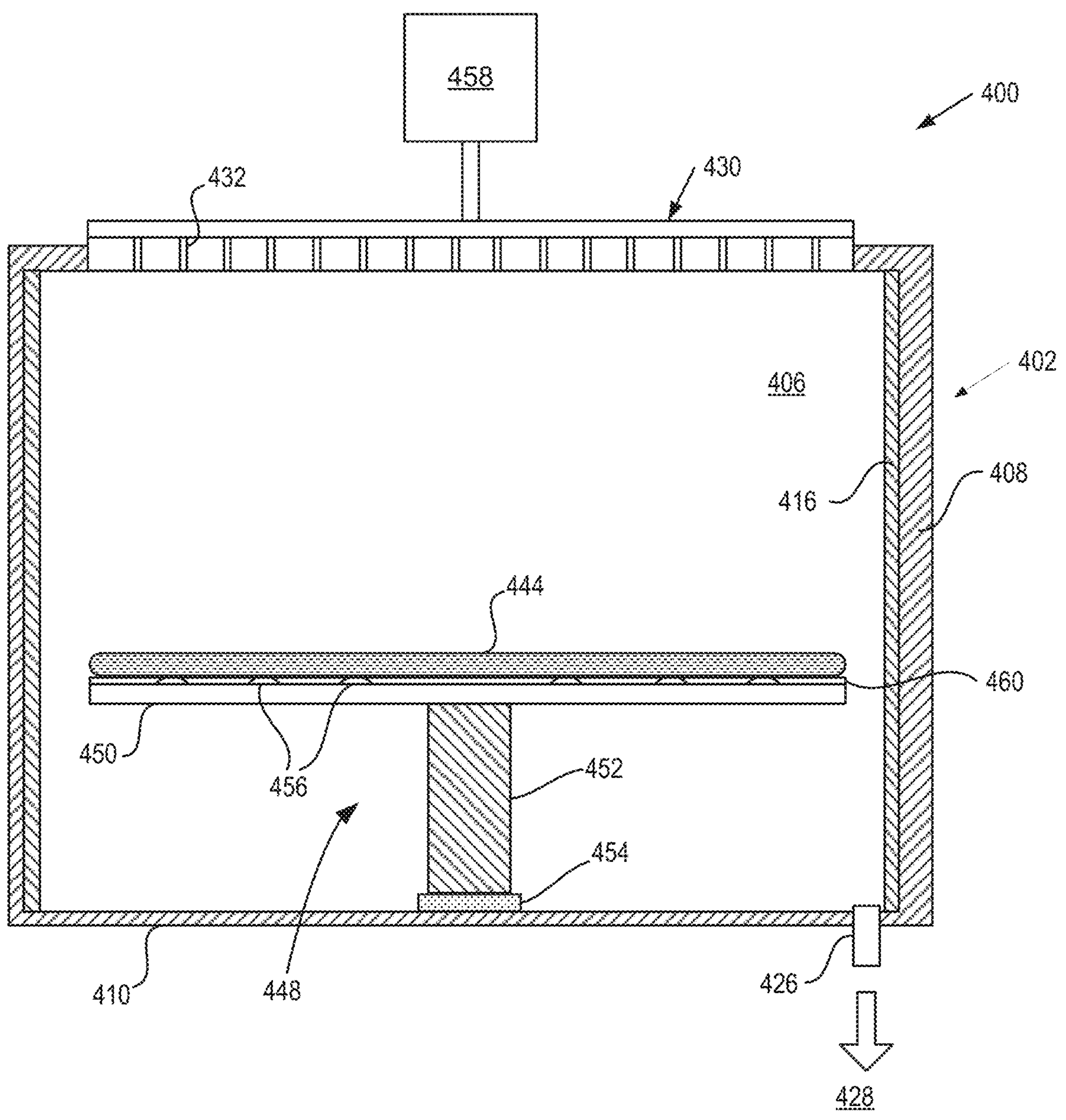
FIG. 4 depicts a sectional view of a processing chamber.

FIG. 4 is a sectional view of a semiconductor processing chamber 400 having one or more chamber components that have been coated or formed from a nanopowder in accordance with embodiments. The base materials of the chamber may include one or more of aluminum (Al), titanium (Ti) and stainless steel (SST). The processing chamber 400 may be used for processes in which a corrosive plasma environment having plasma processing conditions is provided. For example, the processing chamber 400 may be a chamber for a plasma etcher or plasma etch reactor, a plasma cleaner, plasma enhanced CVD or ALD reactors and so forth. Examples of chamber components that may have a nanoceramic coating or which may be molded from a nanopowder described herein include, but are not limited to, a showerhead, a gas distribution plate, a chamber lid and/or a nozzle. Nanoceramic materials having a nanocrystalline structure can provide bulk materials with a grain size of less than about 100 nm and properties unseen with microcrystalline materials previously known in the art.

In one embodiment, the processing chamber 400 includes a chamber body 402 and a showerhead 430 that encloses an interior volume 406. The showerhead 430 may include a showerhead base and a showerhead gas distribution plate. Alternatively, the showerhead 430 may be replaced by a lid and a nozzle in some embodiments, or by multiple pie shaped showerhead compartments and plasma generation units in other embodiments. The chamber body 402 may be fabricated from aluminum, stainless steel or other suitable material such as titanium (Ti). The chamber body 402 generally includes sidewalls 408 and a bottom 410. An outer liner 416 may be disposed adjacent the sidewalls 408 to protect the chamber body 402.

An exhaust port 426 may be defined in the chamber body 402, and may couple the interior volume 406 to a pump system 428. The pump system 428 may include one or more pumps and throttle valves utilized to evacuate and regulate the pressure of the interior volume 406 of the processing chamber 400.

The showerhead 430 may be supported on the sidewall 408 of the chamber body 402. The showerhead 430 (or lid) may be opened to allow access to the interior volume 406 of the processing chamber 400, and may provide a seal for the processing chamber 400 while closed. A gas panel 458 may be coupled to the processing chamber 400 to provide process and/or cleaning gases to the interior volume 406 through the showerhead 430 or lid and nozzle. Showerhead 430 may be used for processing chambers used for dielectric etch (etching of dielectric materials). The showerhead 430 may include a gas distribution plate (GDP) and may have multiple gas delivery holes 432 throughout the GDP. The showerhead 430 may include the GDP bonded to an aluminum base or an anodized aluminum base. The GDP may be made from Si or SiC, or may be a ceramic such as $Y_2O_3$, $Al_2O_3$, $Y_3Al_5O_{12}$ (YAG), and so forth.

For processing chambers used for conductor etch (etching of conductive materials), a lid may be used rather than a showerhead. The lid may include a center nozzle that fits into a center hole of the lid. The lid may be a ceramic such as $Al_2O_3$, $Y_2O_3$, YAG, or a ceramic compound comprising $Y_4Al_2O_9$ and a solid-solution of $Y_2O_3$—$ZrO_2$. The nozzle may also be a ceramic, such as $Y_2O_3$, YAG, or the ceramic compound comprising $Y_4Al_2O_9$ and a solid-solution of $Y_2O_3$—$ZrO_2$.

Examples of processing gases that may be used to process substrates in the processing chamber 400 include halogen-containing gases, such as $C_2F_6$, $SF_6$, $SiCl_4$, HBr, $NF_3$, $CF_4$, $CHF_3$, $CH_2F_3$, F, $NF_3$, $Cl_2$, $CCl_4$, $BCl_3$ and $SiF_4$, among others, and other gases such as $O_2$, or $N_2O$. Examples of carrier gases include $N_2$, He, Ar, and other gases inert to process gases (e.g., non-reactive gases).

A heater assembly 448 is disposed in the interior volume 406 of the processing chamber 400 below the showerhead 430 or lid. The heater assembly 448 includes a support 450 that holds a substrate 444 during processing. The support 450 is attached to the end of a shaft 452 that is coupled to the chamber body 402 via a flange 454. The support 450, shaft 452 and flange 454 may be constructed of a heater material containing AlN, for example, an AlN ceramic. The support 450 may further include mesas 456 (e.g., dimples or bumps). The support may additionally include wires, for example, tungsten wires (not shown), embedded within the heater material of the support 450. In one embodiment, the support 450 may include metallic heater and sensor layers that are sandwiched between AlN ceramic layers. Such an assembly may be sintered in a high-temperature furnace to create a monolithic assembly. The layers may include a combination of heater circuits, sensor elements, ground planes, radio frequency grids and metallic and ceramic flow channels. The heater assembly 448 may provide a heater temperature up to about 650° C. under vacuum conditions (e.g., about 1 mTorr to about 5 Torrs). A nanoceramic coating 460 formed from a nanopowder in accordance with embodiments described herein may be deposited on the support 450 or on all surfaces of the heater assembly 448 (including the support 450, shaft 452 and flange 454) within the chamber 400.

Advantages of the nanopowders, nanoceramic materials and methods of making and use thereof will be apparent to those of ordinary skill in the art. Additionally, it should be noted that nanomaterials formed and described herein may have improved mechanical properties such as flexural strength and fracture toughness as compared to known micro-grained materials. Furthermore, bulk nanomaterials (e.g., with a grain size of less than 100 nm) as formed and described herein may have advantageous properties over their microcrystalline counterparts. The nanomaterials formed and described herein can form dense nanocomposites while retaining nanocrystalline structure with limited or no explosive grain growth.

The preceding description sets forth numerous specific details such as examples of specific systems, components, methods, and so forth, in order to provide a good understanding of several embodiments described herein. It will be apparent to one skilled in the art, however, that at least some embodiments described herein may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%. When the term "at least about" is used herein, it is intended to mean that the nominal value presented is precise within −10% and anything higher. Similarly, when the term "less than about" is used herein, it is intended to mean that the nominal value presented is precise within +10% and anything lower.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope should, therefore, be determined with reference to the appended claims, along with the full scope of equivalents to which such claims are entitled.

What is claimed is:

1. A method of forming a nanoceramic coating on a chamber component for a processing chamber, comprising:

plasma spraying a nanopowder onto a surface of the chamber component, wherein the nanopowder comprises a plurality of nanoparticles, at least a portion of the plurality of nanoparticles comprising:

a core particle comprising a first material comprising a rare earth metal-containing oxide, a rare earth metal-containing fluoride, a rare earth metal-containing oxyfluoride, zirconium oxide, or a combination thereof; and a thin film coating over the core particle, the thin film coating comprising a second material comprising a rare earth metal-containing oxide, a rare earth metal-containing fluoride, a rare earth metal-containing oxyfluoride, zirconium oxide, or a combination thereof, wherein the portion of the plurality of nanoparticles has a donut-shape comprising a spherical form with indentations on opposite sides, and wherein at least one of the first material or the second material comprises a rare earth metal-containing fluoride or a rare earth metal-containing oxyfluoride.

2. The method of claim 1, wherein each of the first material and the second material is independently selected from a group consisting of yttria ($Y_2O_3$), yttrium fluoride ($YF_3$), yttrium oxyfluoride ($Y_xO_yF_z$), erbium oxide ($Er_2O_3$), erbium fluoride ($ErF_3$), erbium oxyfluoride ($Er_xO_yF_z$), dysprosium oxide ($Dy_2O_3$), dysprosium fluoride ($DyF_3$), dysprosium oxyfluoride ($Dy_xO_yF_z$), gadolinium oxide ($Gd_2O_3$), gadolinium fluoride ($GdF_3$), gadolinium oxyfluoride ($Gd_xO_yF_z$), scandium oxide ($Sc_2O_3$), scandium fluoride ($ScF_3$), scandium oxyfluoride ($Sc_xO_yF_z$) and combinations thereof.

3. The method of claim 1, wherein the plurality of nanoparticles comprises about 60 mol % to about 70 mol % of the first material and about 30 mol % to about 40 mol % of the second material.

4. The method of claim 1, wherein (a) the core particle comprises yttrium oxide or yttrium fluoride and the thin film coating comprises zirconium oxide or (b) the core particle comprises zirconium oxide and the thin film coating comprises yttrium oxide or yttrium fluoride.

5. The method of claim 1, further comprising sintering the plurality of nanoparticles to form the nanoceramic coating on the surface of the chamber component.

6. The method of claim 1, further comprising sintering the plurality of nanoparticles by applying a temperature of about 2730° F. to about 3275° F., a pressure of about 25 MPa to about 1 GPa, or a combination thereof.

7. The method of claim 1, wherein the chamber component is selected from the group consisting of a shower head, a nozzle, a gas distribution plate, and a chamber lid.

8. The method of claim 1, wherein the nanoceramic coating comprises:

a density of about 1 $g/cm^3$ to about 10 $g/cm^3$, a flexural strength of about 170 MPa to about 250 MPa, a modulus of elasticity of about 100 GPa to about 300 GPa, a fracture toughness of about 0.1 $Mpam^{1/2}$ to about 5.0 $Mpam^{1/2}$, a coefficient of thermal expansion of about $1.0\times10^6$ to about $15\times10^6$, a volumetric resistivity of about $1.0\times10^{16}$ Ohm-cm to about $10\times10^{16}$ Ohm-cm, a dielectric constant at 13.56 MHz of about 5 to about 25, a dielectric loss tangent at 13.56 MHz of less than about $10\times10^4$, a thermal conductivity of about 1.0 W/mK to about 15 W/mK, or a combination of any two or more thereof.

9. A method of forming a nanoceramic coating on a chamber component for a processing chamber, comprising:

plasma spraying a nanopowder onto a surface of the chamber component, wherein the nanopowder comprises a plurality of nanoparticles, at least a portion of the plurality of nanoparticles comprising:

a core particle comprising a first material comprising a rare earth metal-containing oxide, a rare earth metal-containing fluoride, a rare earth metal-containing oxyfluoride, zirconium oxide, or a combination thereof; and a thin film coating over the core particle, the thin film coating comprising a second material comprising a rare earth metal-containing oxide, a rare earth metal-containing fluoride, a rare earth metal-containing oxyfluoride, zirconium oxide, or a combination thereof, wherein the thin film coating is conformal to the core particle, and wherein at least one of the first material or the second material comprises a rare earth metal-containing fluoride or a rare earth metal-containing oxyfluoride.

10. The method of claim 9, wherein each of the first material and the second material is independently selected from a group consisting of yttria ($Y_2O_3$), yttrium fluoride ($YF_3$), yttrium oxyfluoride ($Y_xO_yF_z$), erbium oxide ($Er_2O_3$), erbium fluoride ($ErF_3$), erbium oxyfluoride ($Er_xO_yF_z$), dysprosium oxide ($Dy_2O_3$), dysprosium fluoride ($DyF_3$), dysprosium oxyfluoride ($Dy_xO_yF_z$), gadolinium oxide ($Gd_2O_3$), gadolinium fluoride ($GdF_3$), gadolinium oxyfluoride ($Gd_xO_yF_z$), scandium oxide ($Sc_2O_3$), scandium fluoride ($ScF_3$), scandium oxyfluoride ($Sc_xO_yF_z$) and combinations thereof.

11. The method of claim 9, wherein the plurality of nanoparticles comprises about 60 mol % to about 70 mol % of yttrium oxide the first material and about 30 mol % to about 40 mol % of the second material zirconium oxide.

12. The method of claim 9, wherein (a) the core particle comprises yttrium oxide or yttrium fluoride and the thin film coating comprises zirconium oxide or (b) the core particle comprises zirconium oxide and the thin film coating comprises yttrium oxide or yttrium fluoride.

13. The method of claim 9, further comprising sintering the plurality of nanoparticles to form the nanoceramic coating on the surface of the chamber component.

14. The method of claim 9, further comprising sintering the plurality of nanoparticles by applying a temperature of about 2730° F. to about 3275° F., a pressure of about 25 MPa to about 1 GPa, or a combination thereof.

15. The method of claim 9, wherein the chamber component is selected from the group consisting of a shower head, a nozzle, a gas distribution plate, and a chamber lid.

16. The method of claim 15, wherein the nanoceramic coating comprises about 60 mol % to about 70 mol % of the first material and about 30 mol % to about 40 mol % of the second material.

17. A method of forming a nanoceramic coating on a chamber component for a processing chamber, comprising:

plasma spraying a nanopowder onto a surface of the chamber component, wherein the nanopowder comprises a plurality of nanoparticles, at least a portion of the plurality of nanoparticles comprising:

a core particle comprising a first material comprising a rare earth metal-containing oxide, a rare earth metal-containing fluoride, a rare earth metal-containing oxyfluoride, zirconium oxide, or a combination thereof; and a thin film coating over the core particle, the thin film coating comprising a second material comprising a rare earth metal-containing oxide, a rare earth metal-containing fluoride, a rare earth metal-containing oxyfluoride, zirconium oxide, or a combination thereof, wherein the thin film coating has a thickness of about 1 nm to about 500 nm, and wherein at least one of the first material or the second material comprises a rare earth metal-containing fluoride or a rare earth metal-containing oxyfluoride.

* * * * *